(12) United States Patent
Ortiz et al.

(10) Patent No.: US 7,034,558 B2
(45) Date of Patent: Apr. 25, 2006

(54) TEST SYSTEM FOR DEVICE AND METHOD THEREOF

(75) Inventors: Alfred E. Ortiz, Gilbert, AZ (US); Joseph Collins, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 366 days.

(21) Appl. No.: 10/209,745

(22) Filed: Jul. 31, 2002

(65) Prior Publication Data
US 2004/0022039 A1 Feb. 5, 2004

(51) Int. Cl.
*G01R 31/02* (2006.01)

(52) U.S. Cl. ...................................... 324/761

(58) Field of Classification Search ................ 324/757, 324/760–761, 765; 174/260–261, 256; 361/760–764, 361/785; 439/65–66, 74
See application file for complete search history.

(56) References Cited

U.S. PATENT DOCUMENTS

| | | | |
|---|---|---|---|
| 4,668,041 A * | 5/1987 | La Komski et al. ..... 324/158.1 |
| 5,430,614 A | 7/1995 | Difrancesco | |
| 5,471,151 A | 11/1995 | DiFrancesco | |
| 5,506,514 A * | 4/1996 | Difrancesco ................ 324/757 |
| 5,642,055 A * | 6/1997 | Difrancesco ................ 324/757 |
| 5,929,649 A * | 7/1999 | Cramer ....................... 324/761 |
| 6,049,217 A * | 4/2000 | Viswanath et al. ......... 324/760 |
| 6,384,618 B1 * | 5/2002 | Pursel et al. ................ 324/765 |

\* cited by examiner

*Primary Examiner*—Jermele Hollington

(57) ABSTRACT

In one embodiment, a contactor (200) is provided. The contactor (200) comprises a device side (210), a test circuit board side (155), and a thickness (110). The device side (210) is in communication with at least three electrical contact points (140, 141, 142) of the device (170). The test circuit board side (155) includes a fourth electrical contact point (193) in electrical communication with the circuit board (150). The contactor (200) also includes a first electrical pathway (220) between the first electrical contact point (140) and the second electrical contact point (142). The first electrical pathway (220) bypasses the circuit board (150). The contactor (200) further includes a second electrical pathway (270) between the third electrical contact point (142) and the fourth electrical contact point (193).

14 Claims, 2 Drawing Sheets

TEST SYSTEM FOR DEVICE AND METHOD THEREOF

BACKGROUND OF THE INVENTION

The present invention relates generally to contactors for connecting electronic devices to circuit boards.

There are various methods of connecting an electronic device to a circuit board. However, when a device is under test, it is not desirable to permanently secure the device to the test circuit board. Therefore, a temporary contactor is often used. These contactors are widely available and have pads, spring loaded pads, pogo pins, leads, probes, or sockets, to make contact with the leads or input/output terminals of an electronic device.

FIG. 1 illustrates one conventional contactor 100. The contactor 100 is secured to a test circuit board 50. The electrical device 70 to be tested is then connected to the contactor 100. In actual operation, the electrical device 70 would be soldered or otherwise directly connected to a circuit board. However, soldering the electrical device 70 directly to the test circuit board 50 would be too time consuming and expensive, and removal might be destructive to the device 70. Therefore, the contactor 100 is used to provide the temporary electrical contact between the device 70 and the test circuit board 50.

The thickness 110 of the contactor 100 creates a test environment that does not otherwise occur in actual operation. For example, the electrical pathway 120 from the device lead 40 through the contactor 100, the test circuit board 50, back through the contactor 100, and to another device lead 41 is longer than the path would be if the device 70 was actually soldered to the circuit board. This causes inductance (between the device 70 and the circuit board 50) that is not present when the device is in use. For LNAs (low noise amplifiers), inductance on the emitter pin has been a historic problem with testing. Inductance interferes with the test for gain, third order intercept (the measure of the non-linearity of the amplifier), and noise figure (the ratio of the input-signal-to-noise ratio and the output-signal-to-noise ratio).

To account for the inductance, typical test methods employ a mathematical correction to compensate for the difference between test conditions and actual conditions. For example, for gain, the device will test lower than in actual use. Therefore, a mathematical correction for gain is applied. For third-order intercept, the device will typically test high. Therefore, another mathematical correction must be made. Because of the complex nature of various circuits, these mathematical corrections are not completely accurate.

DETAILED DESCRIPTION OF EXAMPLE EMBODIMENTS OF THE PRESENT INVENTION

Figure 2:
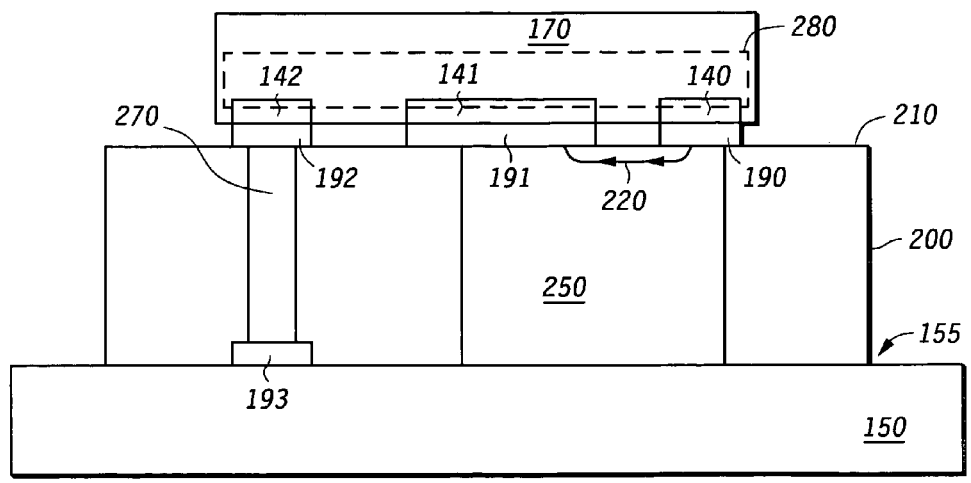
FIG. 2 illustrates one example embodiment of the present invention.

FIG. 2 shows a cross-sectional view of an example embodiment of the present invention. A device 170 under test is connected to a contactor 200, which is mounted on a test circuit board 150. The contactor 200 includes a top surface 210 and a bottom surface 155. The top surface 210 includes at least three electrical contact points 190, 191, and 192 that provide electrical contact with three electrical contact points 140, 141, and 142 of the device 170. The bottom surface 155 of the contactor 200 includes a fourth electrical contact point 193 that provides electrical contact with the circuit board 150.

FIG. 2 shows a slug 250 within the contactor 200 below the first electrical contact point 190 of the contactor 200 and the second electrical contact point 191 of the contactor 200. The slug 250 is conductive and provides an electrical pathway 220 near the top surface 210 of the contactor 200 between the first and second electrical contact points 190 and 191. The electrical pathway 220 is near the top surface 210 of the contactor 200 and bypasses the circuit board 150. A circuit 270 from the third and fourth electrical contact points 192 and 193 of the contactor 200 brings the contact point 142 of the device 170 in electrical communication with the test circuit board 150.

Figure 1:
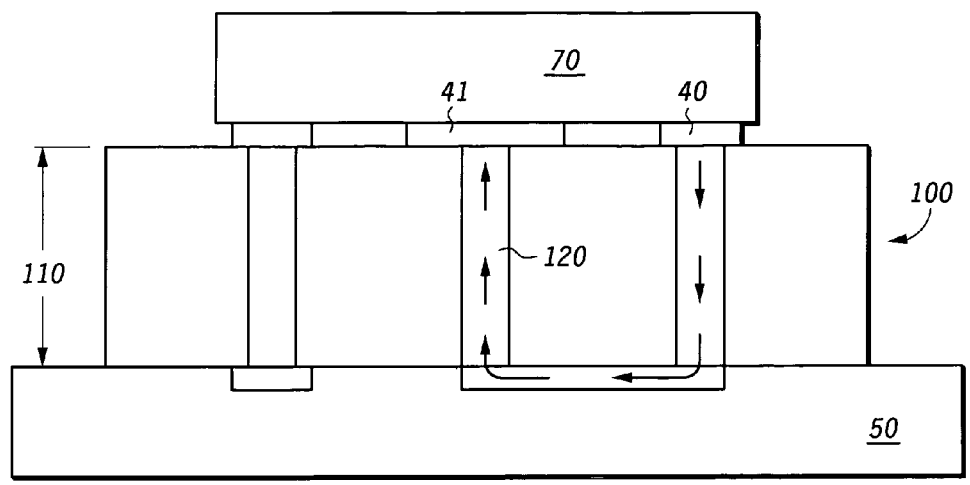
FIG. 1 illustrates a conventional contactor.

Comparing FIG. 2 and FIG. 1, the electrical pathway 220 through the slug 250 of FIG. 2 is shorter than the electrical pathway 120 of FIG. 1. By providing an electrical pathway 220, which bypasses the circuit board 150 near the top surface 210 of the contactor 200, the problematic inductance caused by conventional contactors (FIG. 1) is reduced.

Depending on the type of device 170, the number and type of electrical contact points 140, 141, and 142, for the device 170, and electrical contact points 190, 191, 192, and 193, for the contactor 200, will vary. For example, in various alternate embodiments, the electrical contact points 140, 141, 142 of the device 170 and the electrical contact points 190, 191, 192, and 193 of the contactor 200 include pads, springs, IOs, pogo pins, pins, leads, and/or any other electrical contact points.

While FIG. 2 illustrates a conductive slug 250 to provide an electrical pathway 220 between the first electrical contact point 190 and the second electrical contact point 191 of the contactor 200, in alternate embodiments, the electrical contact points 190 and 191 are electrically connected by a wire, lead, circuit, or any other component that provides an electrical pathway that is near the device 170 and bypasses the circuit board 150.

Furthermore, FIG. 2 illustrates the contactor with a top surface 210 and bottom surface 155; however, those of ordinary skill in the art will recognize that the contactor 200 may be oriented in any direction. In various orientations, such as vertical, angular, or up-side down, the top surface 210 is simply the device side and the bottom surface 155 is simply the circuit-board side. In one specific example embodiment, the device 170 includes a LNA (low noise amplifier) 280. The first electrical contact point 140 includes an emitter pin and is electrically connected to the second electrical contact point 141 (another pin) that is grounded. Thus, the emitter pin 140 will effectively be shorted to ground. By shorting the emitter pin 140, near the top surface 210 of the contactor 200, the emitter pin 140 inductance will be reduced. Thus, for testing a low noise amplifier, the problem of emitter pin inductance during tests will be reduced by the contactor 200 of FIG. 2.

Figure 3:
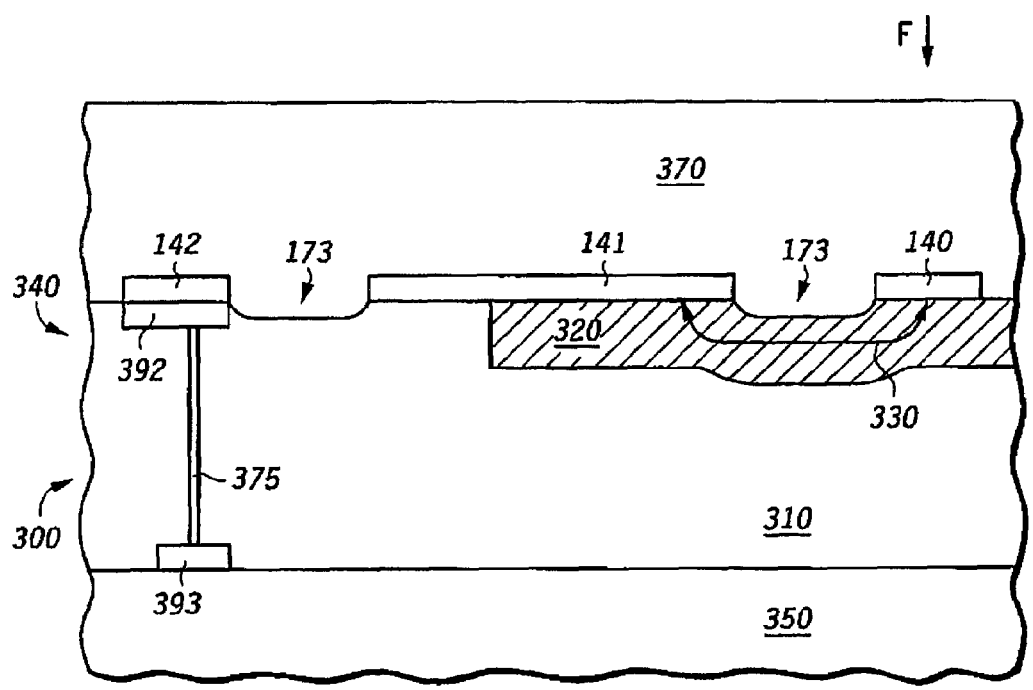
FIG. 3 illustrates aspects of an alternative embodiment of the present invention.

Turning now to FIG. 3, an alternative embodiment of the present invention is seen in which a contactor 300 includes a base 310 made of a compliant material. The example contactor 300 also includes a flexible circuit 320 located above the base 310 and connected to the base 310. The device 370 illustrated in FIG. 3 includes protrusions 173 between, between and extending beyond, the electrical contact points 140, 141, and 142 of the device 370. When a force F is applied to the device 370, and the protrusion 173 is forced against the contactor 300, the compliant base 310 gives beneath the flexible circuit 320 allowing the flexible circuit 320 to bend around the protrusion 173 and make contact with the electrical contact points 140 and 141 of the device 370. Once making contact, the flexible circuit 320 provides an electrical pathway 330, which is near the device 370, and which bypasses the circuit board 350. Thus, the inductance associated with the elongated electrical pathway 120 of FIG. 1 is reduced. Returning to FIG. 3, the contactor 300 includes a circuit 375 between electrical contact points 392 and 393. The electrical contact point 142 of the device 370 makes contact with the electrical contact point 392 of the contactor 300, and contact point 393 makes contact with the circuit board 350, bringing the device 370 in communication with the circuit board 350 through the circuit 375.

In various alternate embodiments, to maintain the contact between the flexible circuit 320 and the contact points 140 and 141 of the device 370, the device 370 is held down by hand, by using a socket, using a clamp, using a clasp, using a test handler, or any other method or device to maintain the force F sufficient to cause the complaint base 310 to give way, allowing the flexible circuit 320 to make contact with contact points 140 and 141. In various alternate embodiments, the compliant base 310 includes rubber, elastomer, and/or any other compliant material or mechanism, and the circuit 320 includes a flexible conductor, thin metal, or any other flexible circuit that will occur to those of ordinary skill.

The previous contactors 200 (FIG. 2) and 300 (FIG. 3) have been described with devices 170 under test and a test circuit board. However, in alternate embodiments, the contactors 200 and 300 are used in actual operation; for example, they are contactors for motherboards in computers.

Various functions are performed by the previously described structures or their equivalents and a system is provided by those functions. Returning to FIG. 2, in one example, a system for electrically connecting a device 170 under test and a test circuit board 150 is provided. The device 170 has at least a first electrical contact point 140, a second electrical contact point 141, and a third electrical contact point 142. The system includes means for electrically bypassing the circuit board 150 between the first electrical contact point 140 and the second electrical contact point 141. The system also includes means for bringing the third electrical contact point 142 in communication with the circuit board 150. In FIG. 2, the means for electrically bypassing includes a slug 250, and the means for bringing the third electrical contact point 142 in communication with the circuit board 150 includes a circuit 270. In FIG. 3, the means for electrically bypassing includes a flexible circuit 320 and the means for bringing the third electrical contact point 142 in communication with the circuit board 350 includes a circuit 375.

In alternate embodiments, the means for electrically bypassing includes a wire, a circuit, or any other means for electrically bypassing, and the means for bringing the third electrical contact point 142 in communication with the circuit board includes a wire, a lead, a pin, pogo pin, an I/O, a conductor, or any other means for bringing the third electrical contact point 142 in communication with the circuit board.

Even further, the apparatuses and systems described above perform a method; and, in yet a further embodiment of the present invention, a method for electrically connecting a device under test and a test circuit board is provided. The device has at least a first electrical contact point, a second electrical contact point, and a third electrical contact point. The method includes electrically bypassing the circuit board between the first and the second electrical contact points. The method further includes bringing the third electrical contact point in communication with the circuit board and applying a test method. In testing an amplifier, test methods include tests for gain, third order intercept, and noise figure.

The example embodiments of the present invention have been described with a certain degree of particularity; however, many changes may be made in the details without departing from the scope of the invention. It is understood that the invention is not limited to the embodiments set forth herein, but is to be limited only by the scope of the attached claims, including the full range of equivalency to which each element thereof is entitled.

We claim:

1. A system for electrically connecting a device under test and a test circuit board, the device comprising at least a first electrical contact point, a second electrical contact point, and a third electrical contact point, the system comprising:
   a contactor for electrically connecting the device under test to the test circuit board,
   the contactor including:
      means for electrically bypassing the test circuit board between the first electrical contact point and the second electrical contact point; and
      means for bringing the third electrical contact point in electrical communication with the test circuit board;
   wherein the contactor includes a device side and a circuit board side:
   wherein the device side faces the device under test and the circuit board side faces the test circuit board during a test of the device under test;
   wherein the contactor further includes dielectric material located between the circuit board side and the device side, the dielectric material including a portion located between the means for electrically bypassing the test circuit board and the means for bringing the third electrical contact point in electrical communication with the test circuit board.

2. The system of claim 1, wherein the means for electrically bypassing further comprises means for shorting the first electrical contact point to the second electrical contact point.

3. A system for electrically connecting a device under test and a test circuit board, the device comprising at least a first electrical contact point, a second electrical contact point, and a third electrical contact point, the system comprising:
   a contactor for electrically connecting the device under test to the test circuit board,
   the contactor including;
      means for electrically bypassing the test circuit board between the first electrical contact point and the second electrical contact point; and
      means for bringing the third electrical contact point in electrical communication with the test circuit board;
   wherein the means for electrically bypassing comprises a slug.

4. A system for electrically connecting a device under test and a test circuit board, the device comprising at least a first electrical contact point, a second electrical contact point, and a third electrical contact point, the system comprising:
   a contactor for electrically connecting the device under test to the test circuit board,
   the contactor including:
      means for electrically bypassing the test circuit board between the first electrical contact point and the second electrical contact point; and means for bringing the third electrical contact point in electrical communication with the test circuit board;

wherein the means for electrically bypassing comprises a flexible circuit.

5. A system for electrically connecting a device under test and a test circuit board, the device comprising at least a first electrical contact point, a second electrical contact point, and a third electrical contact point, the system comprising:

means for electrically bypassing the test circuit board between the first electrical contact point and the second electrical contact point; and means for bringing the third electrical contact point in electrical communication with the test circuit board;

wherein means for bypassing comprise a means for shorting an emitter pin of an amplifier to ground.

6. A method for testing an electronic device, the method comprising:

electrically connecting the device to a test circuit board using a contactor, the contactor includes a circuit board side and the test circuit board includes a side, the device having at least a first electrical contact point, a second electrical contact point, and a third electrical contact point;

electrically bypassing the test circuit board between the first electrical contact point and the second electrical contact point using a first electrical pathway of the contactor;

bringing the third electrical contact point in communication with the test circuit board using a second electrical pathway of the contactor; and applying a test method to the device;

wherein the electrically connecting the device to a test circuit board further includes having the contactor positioned such that the circuit board side faces the side of the test circuit board;

wherein the contactor includes a device side;

wherein the contactor includes dielectric material located between the circuit board side and the device side, the dielectric material including a portion located between the first electrical pathway and the second electrical pathway.

7. The method of claim 6 wherein:

the contactor includes a fourth electrical contact point electrically connected to the second electrical pathway;

the test circuit board includes an electrical contact point;

wherein the bringing the third electrical contact point in communication with the test circuit board includes the fourth electrical contact point electrically contacting the electrical contact point of the test circuit board.

8. The method of claim 6 wherein the contactor includes a device side wherein the electrically connecting the device to a test circuit board further includes having the contactor positioned such that the device side faces the device under test.

9. A method for testing an electronic device, the method comprising:

electrically connecting the device to a test circuit board, the device having at least a first electrical contact point, a second electrical contact point, and a third electrical contact point;

electrically bypassing the test circuit board between the first electrical contact point and the second electrical contact point;

bringing the third electrical contact point in communication with the test circuit board; and applying a test method to the device;

wherein the device comprises an amplifier; wherein the applying a test method comprises applying a gain test.

10. A method for testing an electronic device, the method comprising:

electrically connecting the device to a test circuit board, the device having at least a first electrical contact point, a second electrical contact point, and a third electrical contact point;

electrically bypassing the test circuit board between the first electrical contact point and the second electrical contact point;

bringing the third electrical contact point in communication with the test circuit board; and applying a test method to the device; wherein the device comprises an amplifier; wherein the applying a test method comprises applying third order intercept test.

11. A method for testing an electronic device, the method comprising:

electrically connecting the device to a test circuit board, the device having at least a first electrical contact point, a second electrical contact point, and a third electrical contact point;

electrically bypassing the test circuit board between the first electrical contact point and the second electrical contact point;

bringing the third electrical contact point in communication with the test circuit board; and applying a test method to the device; wherein the device comprises an amplifier; wherein the applying a test method comprises applying noise figure test.

12. A method for testing an electronic device, the method comprising:

electrically connecting the device to a test circuit board, the device having at least a first electrical contact point, a second electrical contact point, and a third electrical contact point;

electrically bypassing the test circuit board between the first electrical contact point and the second electrical contact point;

bringing the third electrical contact point in communication with the test circuit board; and applying a test method to the device;

wherein the device comprises an amplifier;

wherein the electrically bypassing the test circuit board between the first electrical contact point and the second electrical contact point further comprises shorting the emitter pin of the amplifier to ground.

13. A method of reducing the inductance between an amplifier under test and a test circuit board, the method comprising:

temporarily bringing the amplifier in electrical communication with the test circuit board;

electrically bypassing the test circuit board between an emitter pin of the amplifier and a second pin of the amplifier; and grounding the second pin.

14. A system for electrically connecting a device under test and a test circuit board, the device comprising at least a first electrical contact point, a second electrical contact point, and a third electrical contact point, the system comprising:

a contactor for electrically connecting the device under test to the test circuit board, the contactor including:
   means for electrically bypassing the test circuit board between the first electrical contact point and the second electrical contact point; and
   means for bringing the third electrical contact point in electrical communication with the test circuit board;

wherein the contactor further includes:
a device side;
a circuit board side;
wherein the device side comprises at least three electrical contact points to provide electrical contact with the first electrical contact point, the second electrical contact point, and the third electrical contact point of the device under test;
wherein the circuit board side comprises a fourth electrical contact point to provide electrical contact with the circuit board;

wherein the means for electrically bypassing the test circuit board includes a first electrical pathway between a first electrical contact point of the device side and a second electrical contact point of the device side, wherein the first electrical pathway bypasses the circuit board;

wherein the means for bringing the third electrical contact point includes a second electrical pathway between a third electrical contact point of the device side and the fourth electrical contact point of the circuit board side;

wherein the contactor further includes dielectric material located between the circuit board side and the device side, the dielectric material including a portion located between the first electrical pathway and the second electrical pathway.

* * * * *